(12) United States Patent
Kiehlbauch

(10) Patent No.: US 8,388,851 B2
(45) Date of Patent: Mar. 5, 2013

(54) CAPACITOR FORMING METHODS

(75) Inventor: Mark Kiehlbauch, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 1208 days.

(21) Appl. No.: 11/971,138

(22) Filed: Jan. 8, 2008

(65) Prior Publication Data
US 2009/0176011 A1    Jul. 9, 2009

(51) Int. Cl.
*B05D 5/12*    (2006.01)
(52) U.S. Cl. .................... 216/6; 216/19; 216/39; 427/79
(58) Field of Classification Search .................... None
See application file for complete search history.

(56) References Cited

U.S. PATENT DOCUMENTS

| | | |
|---|---|---|
| 4,517,729 A | 5/1985 | Batra |
| 4,871,688 A | 10/1989 | Lowrey |
| 5,236,860 A | 8/1993 | Fazan et al. |
| 5,252,517 A | 10/1993 | Blalock et al. |
| 5,340,763 A | 8/1994 | Dennison |
| 5,401,681 A | 3/1995 | Dennison |
| 5,467,305 A | 11/1995 | Bertin et al. |
| 5,498,562 A | 3/1996 | Dennison et al. |
| 5,532,089 A | 7/1996 | Adair et al. |
| 5,604,696 A | 2/1997 | Takaishi |
| 5,605,857 A | 2/1997 | Jost et al. |
| 5,652,164 A | 7/1997 | Dennison et al. |
| 5,654,222 A | 8/1997 | Sandhu et al. |
| 5,672,534 A | 9/1997 | Huang |
| 5,686,747 A | 11/1997 | Jost et al. |
| 5,702,990 A | 12/1997 | Jost et al. |
| 5,705,838 A | 1/1998 | Jost et al. |
| 5,767,561 A | 6/1998 | Frei et al. |
| 5,821,140 A | 10/1998 | Jost et al. |
| 5,869,382 A | 2/1999 | Kubota |
| 5,900,660 A | 5/1999 | Jost et al. |
| 5,955,758 A | 9/1999 | Sandhu et al. |

(Continued)

FOREIGN PATENT DOCUMENTS

| DE | 4447804 | 1/2011 |
|---|---|---|
| JP | 4-155810 | 5/1992 |

(Continued)

OTHER PUBLICATIONS

J Robertson, Diamond-like amorphous carbon, Material Science and Engineering R 37 (2002) 129-281.*

(Continued)

*Primary Examiner* — Allan Olsen
(74) *Attorney, Agent, or Firm* — Wells St. John, P.S.

(57) ABSTRACT

A capacitor forming method includes forming an electrically conductive support material over a substrate, forming an opening through at least the support material to the substrate, and, after forming the opening, forming a capacitor structure contacting the substrate and the support material in the opening. The support material contains at least 25 at % carbon. Another capacitor forming method includes forming a support material over a substrate, forming an opening through at least the support material to the substrate, and, after forming the opening, forming a capacitor structure contacting the substrate and the support material in the opening. The support material contains at least 20 at % carbon. The support material has a thickness and the opening has an aspect ratio 20:1 or greater within the thickness of the support material.

20 Claims, 7 Drawing Sheets

U.S. PATENT DOCUMENTS

| | | | |
|---|---|---|---|
| 5,956,594 A | 9/1999 | Yang et al. |
| 5,981,350 A | 11/1999 | Geusic et al. |
| 5,981,992 A | 11/1999 | Calpine Kenney |
| 5,989,953 A | 11/1999 | Liang et al. |
| 5,990,021 A | 11/1999 | Prall et al. |
| 6,037,212 A | 3/2000 | Chao |
| 6,037,218 A | 3/2000 | Dennnison et al. |
| 6,059,553 A | 5/2000 | Jin et al. |
| 6,090,700 A | 7/2000 | Tseng |
| 6,108,191 A | 8/2000 | Bruchhaus et al. |
| 6,110,774 A | 8/2000 | Jost et al. |
| 6,121,084 A | 9/2000 | Coursey |
| 6,133,620 A | 10/2000 | Uochi |
| 6,159,818 A | 12/2000 | Durcan et al. |
| 6,180,450 B1 | 1/2001 | Dennison |
| 6,204,143 B1 | 3/2001 | Roberts et al. |
| 6,204,178 B1 | 3/2001 | Marsh |
| 6,232,168 B1 | 5/2001 | Coursey |
| 6,245,684 B1 | 6/2001 | Zhao et al. |
| 6,249,019 B1 | 6/2001 | Sandhu et al. |
| 6,258,650 B1 | 7/2001 | Sunouchi |
| 6,274,497 B1 | 8/2001 | Lou |
| 6,303,518 B1 | 10/2001 | Tian et al. |
| 6,303,956 B1 | 10/2001 | Sandhu et al. |
| 6,323,528 B1 | 11/2001 | Yamazaki et al. |
| 6,329,683 B2 | 12/2001 | Kohyama |
| 6,331,461 B1 | 12/2001 | Juengling |
| 6,372,554 B1 | 4/2002 | Kawakita et al. |
| 6,372,574 B1 | 4/2002 | Lane et al. |
| 6,383,861 B1 | 5/2002 | Gonzalez et al. |
| 6,399,490 B1 | 6/2002 | Jammy et al. |
| 6,403,442 B1 | 6/2002 | Reinberg |
| 6,432,472 B1 | 8/2002 | Farrell et al. |
| 6,458,653 B1 | 10/2002 | Jang |
| 6,458,925 B1 | 10/2002 | Fasano |
| 6,459,138 B2 | 10/2002 | Reinberg |
| 6,475,855 B1 | 11/2002 | Fishburn |
| 6,476,432 B1 | 11/2002 | Basceri et al. |
| 6,482,749 B1 | 11/2002 | Billington et al. |
| 6,583,063 B1 | 6/2003 | Khan et al. |
| 6,617,222 B1 | 9/2003 | Coursey |
| 6,620,680 B2 | 9/2003 | Durcan et al. |
| 6,620,724 B1 * | 9/2003 | Schroeder et al. ............ 438/628 |
| 6,645,869 B1 | 11/2003 | Chu et al. |
| 6,656,748 B2 | 12/2003 | Hall et al. |
| 6,667,502 B1 | 12/2003 | Agarwal et al. |
| 6,673,693 B2 | 1/2004 | Kirchhoff |
| 6,696,745 B2 | 2/2004 | Sandhu et al. |
| 6,703,273 B2 * | 3/2004 | Wang et al. .................. 438/243 |
| 6,707,088 B2 | 3/2004 | Fishburn |
| 6,709,978 B2 | 3/2004 | Geusic et al. |
| 6,720,232 B1 | 4/2004 | Tu et al. |
| 6,767,789 B1 | 7/2004 | Bronner et al. |
| 6,784,112 B2 | 8/2004 | Arita et al. |
| 6,784,479 B2 | 8/2004 | Park |
| 6,787,833 B1 | 9/2004 | Fishburn |
| 6,812,513 B2 | 11/2004 | Geusic et al. |
| 6,822,261 B2 | 11/2004 | Yamazaki et al. |
| 6,822,280 B2 | 11/2004 | Ito et al. |
| 6,844,230 B2 | 1/2005 | Reinberg |
| 6,849,496 B2 | 2/2005 | Jaiprakash et al. |
| 6,853,023 B2 | 2/2005 | Goebel |
| 6,861,330 B2 | 3/2005 | Basceri et al. |
| 6,890,814 B2 | 5/2005 | Sandhu et al. |
| 6,893,914 B2 | 5/2005 | Kim et al. |
| 6,897,109 B2 | 5/2005 | Jin et al. |
| 6,927,122 B2 | 8/2005 | Geusic et al. |
| 6,927,170 B2 | 8/2005 | Zheng |
| 6,930,640 B2 | 8/2005 | Chung et al. |
| 6,936,880 B2 | 8/2005 | Park |
| 6,939,794 B2 * | 9/2005 | Yin et al. .................. 438/624 |
| 6,962,846 B2 | 11/2005 | Fishburn et al. |
| 6,991,980 B2 | 1/2006 | Park |
| 7,005,379 B2 | 2/2006 | Sinha et al. |
| 7,042,040 B2 | 5/2006 | Horiguchi |
| 7,053,435 B2 | 5/2006 | Yeo et al. |
| 7,053,453 B2 | 5/2006 | Tsao et al. |
| 7,064,028 B2 | 6/2006 | Ito et al. |
| 7,064,365 B2 | 6/2006 | An et al. |
| 7,067,385 B2 | 6/2006 | Manning |
| 7,071,055 B2 | 7/2006 | Fishburn |
| 7,073,969 B2 | 7/2006 | Kamm |
| 7,074,669 B2 | 7/2006 | Iijima et al. |
| 7,081,384 B2 | 7/2006 | Birner et al. |
| 7,084,451 B2 | 8/2006 | Forbes et al. |
| 7,094,701 B2 | 8/2006 | Umemoto et al. |
| 7,115,500 B1 | 10/2006 | Torres |
| 7,115,531 B2 * | 10/2006 | Shaffer et al. .................. 438/780 |
| 7,122,424 B2 | 10/2006 | Tu et al. |
| 7,125,781 B2 | 10/2006 | Manning et al. |
| 7,153,778 B2 | 12/2006 | Busch et al. |
| 7,160,788 B2 | 1/2007 | Sandhu et al. |
| 7,179,706 B2 | 2/2007 | Patraw et al. |
| 7,199,005 B2 | 4/2007 | Sandhu et al. |
| 7,202,127 B2 | 4/2007 | Busch et al. |
| 7,223,690 B2 | 5/2007 | Kondo et al. |
| 7,226,845 B2 | 6/2007 | Manning et al. |
| 7,235,441 B2 | 6/2007 | Yasui et al. |
| 7,235,479 B2 | 6/2007 | Verhaverbeke |
| 7,235,485 B2 | 6/2007 | Kwak et al. |
| 7,268,034 B2 | 9/2007 | Basceri et al. |
| 7,268,039 B2 | 9/2007 | Fishburn et al. |
| 7,271,051 B2 | 9/2007 | Manning et al. |
| 7,273,779 B2 | 9/2007 | Fishburn et al. |
| 7,279,379 B2 | 10/2007 | Tran et al. |
| 7,282,756 B2 | 10/2007 | Agarwal et al. |
| 7,288,806 B2 | 10/2007 | Tran et al. |
| 7,320,911 B2 | 1/2008 | Basceri et al. |
| 7,321,149 B2 | 1/2008 | Busch et al. |
| 7,321,150 B2 | 1/2008 | Fishburn et al. |
| 7,335,935 B2 | 2/2008 | Sinha et al. |
| 7,341,909 B2 | 3/2008 | McDaniel et al. |
| 7,384,847 B2 | 6/2008 | Tran et al. |
| 7,387,939 B2 | 6/2008 | Manning |
| 7,393,741 B2 | 7/2008 | Sandhu et al. |
| 7,393,743 B2 | 7/2008 | Manning |
| 7,413,952 B2 | 8/2008 | Busch et al. |
| 7,420,238 B2 | 9/2008 | Manning et al. |
| 7,439,152 B2 | 10/2008 | Manning |
| 7,440,255 B2 | 10/2008 | McClure et al. |
| 7,442,600 B2 | 10/2008 | Wang et al. |
| 7,445,990 B2 | 11/2008 | Busch et al. |
| 7,445,991 B2 | 11/2008 | Manning |
| 7,449,391 B2 | 11/2008 | Manning et al. |
| 7,459,362 B2 | 12/2008 | Juengling |
| 7,474,215 B2 | 1/2009 | Scott et al. |
| 7,517,754 B2 | 4/2009 | McDaniel et al. |
| 7,534,694 B2 | 5/2009 | Manning |
| 7,538,036 B2 | 5/2009 | Busch et al. |
| 7,544,563 B2 | 6/2009 | Manning |
| 7,557,013 B2 | 7/2009 | Bhat et al. |
| 7,557,015 B2 | 7/2009 | Sandhu et al. |
| 7,573,088 B2 | 8/2009 | Juengling |
| 7,576,441 B2 * | 8/2009 | Yin et al. ...................... 257/797 |
| 7,629,262 B2 | 12/2009 | Kim et al. |
| 7,638,392 B2 | 12/2009 | Wang et al. |
| 7,655,968 B2 | 2/2010 | Manning |
| 7,682,924 B2 | 3/2010 | Bhat et al. |
| 7,759,193 B2 | 7/2010 | Fishburn |
| 7,785,962 B2 | 8/2010 | Bhat et al. |
| 7,807,580 B2 | 10/2010 | Lee et al. |
| 7,902,081 B2 | 3/2011 | Raghu et al. |
| 8,134,823 B2 | 3/2012 | Chen et al. |
| 2001/0012223 A1 | 8/2001 | Kohyama |
| 2001/0026974 A1 | 10/2001 | Reinberg |
| 2001/0038111 A1 | 11/2001 | DeBoer et al. |
| 2001/0044181 A1 | 11/2001 | Nakamura |
| 2002/0022339 A1 | 2/2002 | Kirchhoff |
| 2002/0030221 A1 | 3/2002 | Sandhu et al. |
| 2002/0039826 A1 | 4/2002 | Reinberg |
| 2002/0090779 A1 | 7/2002 | Jang |
| 2002/0098654 A1 | 7/2002 | Durcan et al. |
| 2002/0153589 A1 | 10/2002 | Oh |
| 2002/0153614 A1 | 10/2002 | Ema et al. |
| 2002/0163026 A1 | 11/2002 | Park |
| 2003/0085420 A1 | 5/2003 | Ito et al. |
| 2003/0134468 A1 * | 7/2003 | Wang et al. .................. 438/243 |

| | | | |
|---|---|---|---|
| 2003/0153146 A1 | 8/2003 | Won et al. | |
| 2003/0178684 A1 | 9/2003 | Nakamura | |
| 2003/0190782 A1 | 10/2003 | Ko et al. | |
| 2003/0227044 A1 | 12/2003 | Park | |
| 2004/0018679 A1 | 1/2004 | Yu et al. | |
| 2004/0150070 A1 | 8/2004 | Okada et al. | |
| 2004/0188738 A1 | 9/2004 | Farnworth et al. | |
| 2004/0232106 A1 | 11/2004 | Oka et al. | |
| 2004/0259355 A1* | 12/2004 | Yin et al. | 438/689 |
| 2005/0023588 A1 | 2/2005 | Sandhu et al. | |
| 2005/0051822 A1 | 3/2005 | Manning | |
| 2005/0158949 A1 | 7/2005 | Manning | |
| 2005/0176210 A1 | 8/2005 | Kim et al. | |
| 2005/0287738 A1 | 12/2005 | Cho et al. | |
| 2005/0287780 A1 | 12/2005 | Manning et al. | |
| 2005/0287795 A1 | 12/2005 | Torek et al. | |
| 2006/0006502 A1* | 1/2006 | Yin et al. | 257/635 |
| 2006/0014344 A1 | 1/2006 | Manning | |
| 2006/0024958 A1 | 2/2006 | Ali | |
| 2006/0024966 A1 | 2/2006 | Umemoto et al. | |
| 2006/0046420 A1 | 3/2006 | Manning | |
| 2006/0063344 A1 | 3/2006 | Manning et al. | |
| 2006/0063345 A1 | 3/2006 | Manning et al. | |
| 2006/0115951 A1 | 6/2006 | Mosley | |
| 2006/0115952 A1 | 6/2006 | Wu | |
| 2006/0121672 A1 | 6/2006 | Basceri et al. | |
| 2006/0148190 A1 | 7/2006 | Busch | |
| 2006/0176210 A1 | 8/2006 | Nakamura et al. | |
| 2006/0186451 A1 | 8/2006 | Dusberg et al. | |
| 2006/0211196 A1* | 9/2006 | Tanaka et al. | 438/243 |
| 2006/0211211 A1 | 9/2006 | Sandhu et al. | |
| 2006/0237762 A1 | 10/2006 | Park | |
| 2006/0249798 A1 | 11/2006 | Manning | |
| 2006/0261440 A1 | 11/2006 | Manning | |
| 2006/0263968 A1 | 11/2006 | Manning | |
| 2006/0286783 A1 | 12/2006 | Papanu et al. | |
| 2006/0289914 A1 | 12/2006 | Juengling | |
| 2007/0032014 A1 | 2/2007 | Sandhu et al. | |
| 2007/0045699 A1 | 3/2007 | Liao et al. | |
| 2007/0048976 A1 | 3/2007 | Raghu | |
| 2007/0057304 A1 | 3/2007 | Boescke et al. | |
| 2007/0066010 A1* | 3/2007 | Ando | 438/243 |
| 2007/0093022 A1 | 4/2007 | Basceri | |
| 2007/0099328 A1 | 5/2007 | Chiang et al. | |
| 2007/0099423 A1 | 5/2007 | Chen et al. | |
| 2007/0145009 A1 | 6/2007 | Fucsko et al. | |
| 2007/0196978 A1 | 8/2007 | Manning | |
| 2007/0202686 A1 | 8/2007 | Dixit et al. | |
| 2007/0207622 A1 | 9/2007 | Rana et al. | |
| 2007/0238259 A1 | 10/2007 | Bhat | |
| 2007/0257323 A1 | 11/2007 | Tsui et al. | |
| 2008/0090416 A1 | 4/2008 | Raghu et al. | |
| 2008/0171137 A1* | 7/2008 | Kim et al. | 427/80 |
| 2008/0174430 A1 | 7/2008 | Scott et al. | |
| 2009/0047769 A1 | 2/2009 | Bhat et al. | |
| 2009/0176011 A1* | 7/2009 | Kiehlbauch | 427/79 |
| 2009/0251845 A1* | 10/2009 | Kiehlbauch | 361/301.1 |
| 2010/0009512 A1 | 1/2010 | Fishburn | |
| 2010/0041204 A1* | 2/2010 | Kiehlbauch et al. | 438/397 |
| 2010/0112798 A1 | 5/2010 | Lai et al. | |
| 2011/0151655 A1 | 6/2011 | Chan et al. | |
| 2011/0183522 A1 | 7/2011 | Mikhaylichenko et al. | |
| 2011/0227167 A1 | 9/2011 | Chuang et al. | |
| 2012/0012922 A1 | 1/2012 | Jang | |

FOREIGN PATENT DOCUMENTS

| | | |
|---|---|---|
| JP | 1996-27428 | 10/1996 |
| JP | 1998-189912 | 7/1998 |
| JP | 11-026719 | 1/1999 |
| JP | 1999-191615 | 7/1999 |
| JP | 2000-196038 | 7/2000 |
| JP | 2001-189438 | 7/2001 |
| JP | 2003-142605 | 5/2003 |
| JP | 2003-264246 | 9/2003 |
| JP | 2003-273247 | 9/2003 |
| JP | 2003-297952 | 10/2003 |
| JP | 2004-072078 | 3/2004 |
| JP | 2004-111626 | 4/2004 |
| JP | 2004-128463 | 4/2004 |
| JP | 2004-032982 | 2/2005 |
| JP | 2006-032695 | 2/2006 |
| JP | 2006-135364 | 5/2006 |
| KR | 20010061020 | 7/2001 |
| KR | 20010114003 | 12/2001 |
| KR | 102001108963 | 12/2001 |
| KR | 1020030058018 | 7/2003 |
| KR | 1020050000896 | 1/2005 |
| KR | 10-520223 | 10/2005 |
| TW | 513801 | 12/2002 |
| TW | I252511 | 4/2006 |
| TW | I307160 | 3/2009 |
| TW | 098121062 | 8/2012 |
| WO | PCT/US2004/024898 | 2/2005 |
| WO | PCT/US2004/027898 | 2/2005 |
| WO | WO 2005/024936 | 3/2005 |
| WO | PCT/US2004/040252 | 5/2005 |
| WO | WO 2005/062349 | 7/2005 |
| WO | PCT/US2006/006806 | 2/2006 |
| WO | PCT/US2006/006806 | 7/2006 |
| WO | PCT/US2008/070071 | 7/2009 |
| WO | PCT/US2009/046946 | 1/2010 |
| WO | PCT/US2009/046946 | 1/2011 |
| WO | PCT/US2006/006806 | 3/2011 |

OTHER PUBLICATIONS

John Robertson, Hard Amorphous (Diamond-Like) Carbons, Prog Solid St Chem. vol. 21, pp. 199-333, (1991).*

Banhart., "Aluminum Foams: on the road to real applications", MRS Bulletin, Apr. 2003, pp. 290-295.

Crouse et al., "Self-Assembled Nanostructures Using Anodized Alunmina Thin Films for Optoelectronic applications", IEEE, pp. 234-235, 1999.

Gibson et al., "Cellular Solids", MRS Bulletin, Apr. 2003, pp. 270-274.

Green et al., "Cellular Ceramics: Intriguing Structures, Novel Properties, and Innovative Applications", MRS Bulletin, Apr. 2003, pp. 296-300.

Green et al., "The Structure and Applications of Cellular Ceramics", MRS Bulletin, Apr. 2003, 10 pages.

Karp et al., "Scaffolds for Tissue Engineering", MRS Bulletin, Apr. 2003, pp. 301-302.

Kim et al., "A mechanically enhanced storage node for virtually unlimited height (MESH) capacitor aiming at sub 70nm DRAMs", IEEE, Jan. 2004, pp. 69-72.

Konovalov et al., "Chemistry of Materials", CHEM. MATER., vol. 11, No. 8, pp. 1949-1951 (Aug. 1999).

Kraynik, "Foam Structure: From Soap Froth to Solid Foams", MRS Bulletin, Apr. 2003, pp. 275-278.

Li., "Metal-assisted chemical etching in HF/H202 produces porous silicon", Applied Physics Letters, vol. 77, No. 16, Oct. 16, 20000, pp. 2572-2574.

Liang et al., "Nonlithographic Fabrication of Lateral Superlattices for Nanometric Electromagnetic-Optic . . . ", IEEE J. Selected Topics in Quantum Electr., vol. 8, No. 5, pp. 998-1008 (Sep./Oct. 2002).

Liu et al., "Ordered anodic alumina nanochannels on focused-ion-beam-prepatterned aluminum surfaces", appl. Phys. Lett. vol. 78, No. 1, pp. 120-122 (Jan. 2001).

Maire et al., "In Situ X-Ray tomography Measurements of Deformatio in Sellular Solids", MRS Bulletin, Apr. 2003, pp. 284-289.

Masuda et al., "Highly ordered nanochannel-array architecture in anodic alumina", App. Phys. Lett, vol. 71, No. 19, Nov. 1997, pp. 2770-2772.

Nadeem et al., "Fabrication of Microstructures Using Aluminum Anodization Techniques", pre-2004, pp. 274-277.

Oh et al., "Preparation and Pore-Characteristics Control of Nano-Porous Materials Using Organometallic Building Blocks", Carbon Science, vol. 4, No. 1, Mar. 2003, pp. 1-9.

Onch, "Scale Effects in Cellular Metals", MRS Bulletin, Apr. 2003, pp. 279-283.

O'Sullivan et al., "The Morphology and Mechanism of Formation of Porous Anodic Films on Aluminum", Proc. Roy. Soc. Lond. A, vol. 317, 1970, pp. 511-543.

Park et al., "Block Copolymer Lithography: Periodic Arrays of ~1011 Holes in 1 Square Centimeter", Science, vol. 276, May 1997, pp. 1401-1404.

Park et al., "Novel Robust Cell Capacitor (Leaning Exterminated Ring Type Insulator) and New Storage Node Contact", IEEE, 2004 Symposium on VLSI Technology Digest of Technical Papers, pp. 34-35.

Shingubara, "Fabrication of nanomaterials using porous aluina templates", J. Nanoparticle Res., vol. 5, 2003, pp. 17-30.

Tan et al., "High Aspect Ratio Micronstructures on Porous Anodic Aluminum Oxide", IEEE, 1995, pp. 267-272.

Tsukada et al., "Preparation and Application of Porous Silk Fibroin Materials", J. Appl. Polymer Sci., vol. 54, 1994, pp. 507-514.

Yasaitis et al., "A modular process for integrating thick polysilicon MEMS devices with submicron CMOS", Analog Devices, Pre-2004.

"Conductive Polymer" Wikipedia http://en/wikipedia.org/w/index.php?title=Conductive_polymer&printable=yes, Nov. 2007.

U.S. Appl. No. 12/854,446, filed Aug. 11, 2010, Lee.

Terai et al. "Newly developed RELACS process and materials for 65nm node device and beyond", website: ieeexplore.ieee.org/iel5/10631/33565/01595193.pdf, pp. 20-21, Feb. 21, 2006.

* cited by examiner

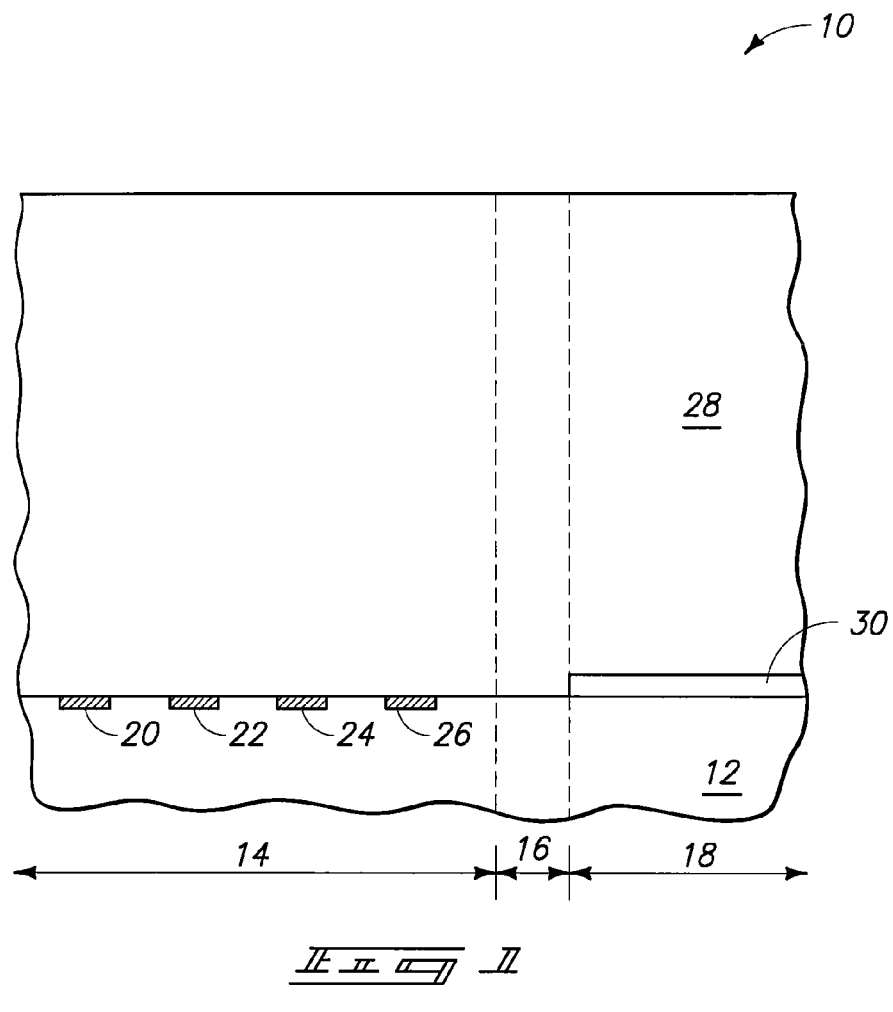
_FIG. 1_
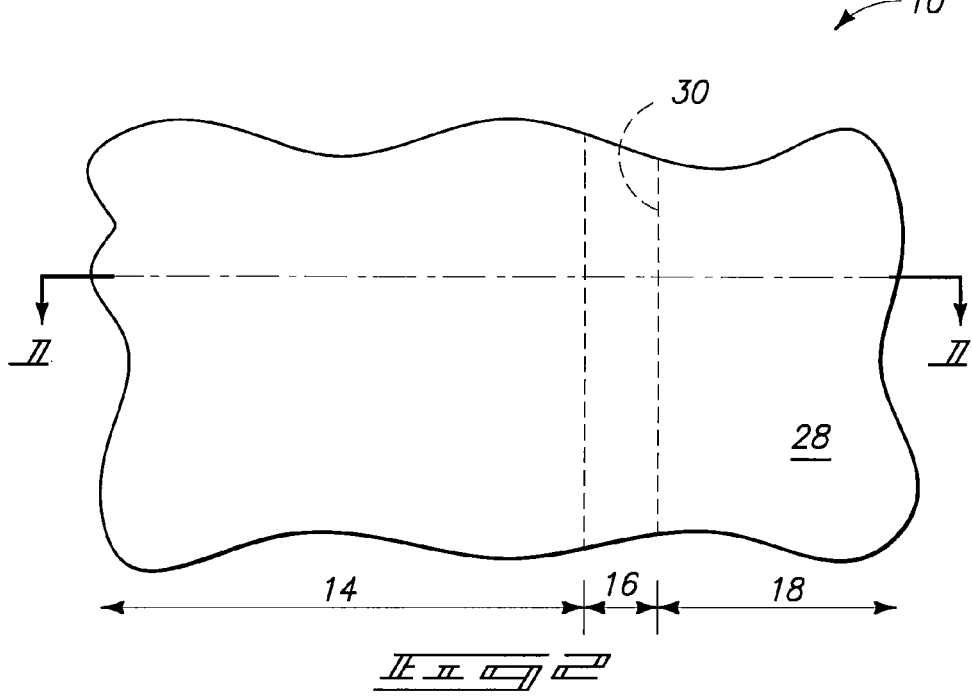
_FIG. 2_

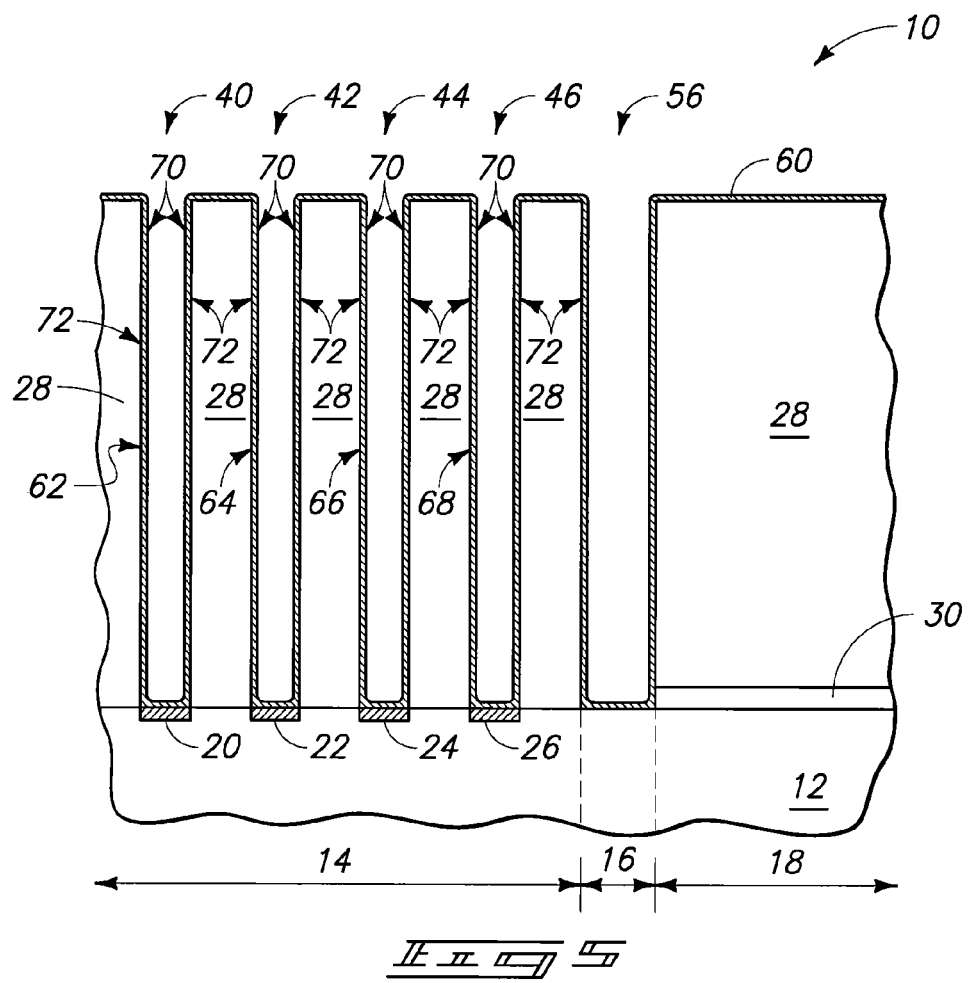
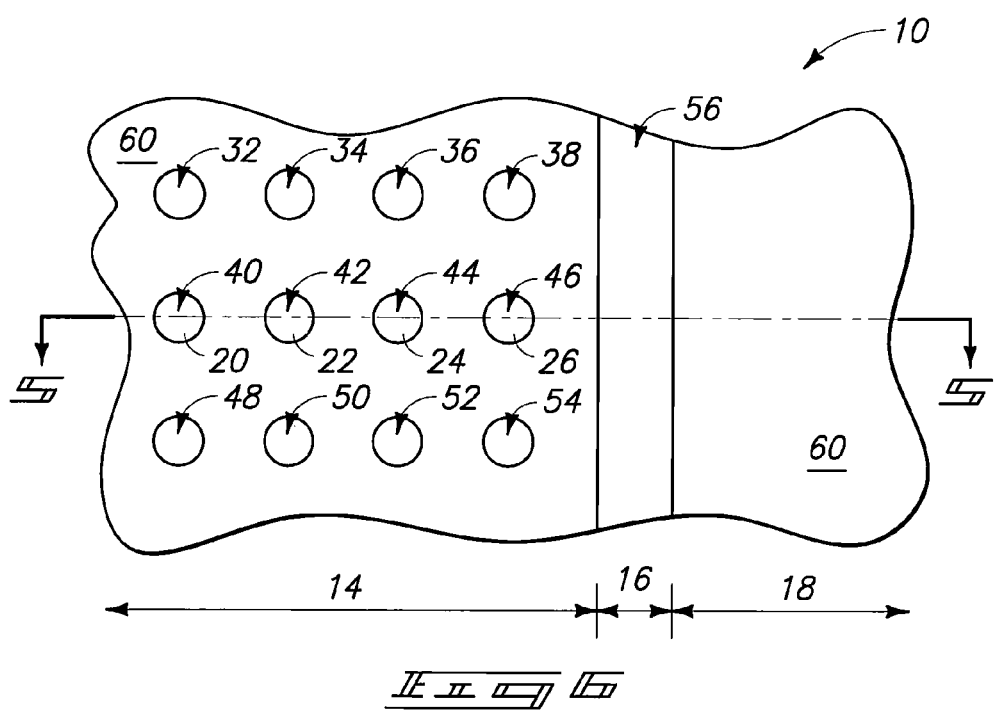

CAPACITOR FORMING METHODS

TECHNICAL FIELD

Capacitor forming methods.

BACKGROUND

Often, openings are formed in support materials so that microelectronic structures may be formed in and their structure supported by the support material. For example, a capacitor container for a dynamic random access memory (DRAM) cell may be etched into a dielectric, such as silicon dioxide, most commonly formed as a doped silicate glass. Use of silicon dioxide dielectric can yield several disadvantages from a patterning standpoint. Dry etch of silicon dioxide has a large physical component, that is, it is more like physical sputtering than like a chemical etch. Its sputtering nature creates difficulty in obtaining a straight profile since the etch exhibits a very small lateral component, leading to a tapered profile.

Accordingly, what the art needs are methods addressing the problems of using silicon dioxide as support material for microelectronic structures.

BRIEF DESCRIPTION OF THE DRAWINGS

FIG. 1 is a diagrammatic, cross-sectional view of a portion of a semiconductor wafer at a preliminary processing stage of an embodiment.

FIG. 2 is a diagrammatic top view of a portion of the semiconductor wafer comprising the cross-section shown in FIG. 1 along the line 1-1.

FIG. 5 is a diagrammatic, cross-sectional view of the FIG. 1 wafer portion shown at a processing stage subsequent to that of FIG. 3.

FIG. 6 is a diagrammatic top view of the wafer portion comprising the cross-section shown in FIG. 5 along the line 5-5.

DETAILED DESCRIPTION OF THE ILLUSTRATED EMBODIMENTS

Figure 3:
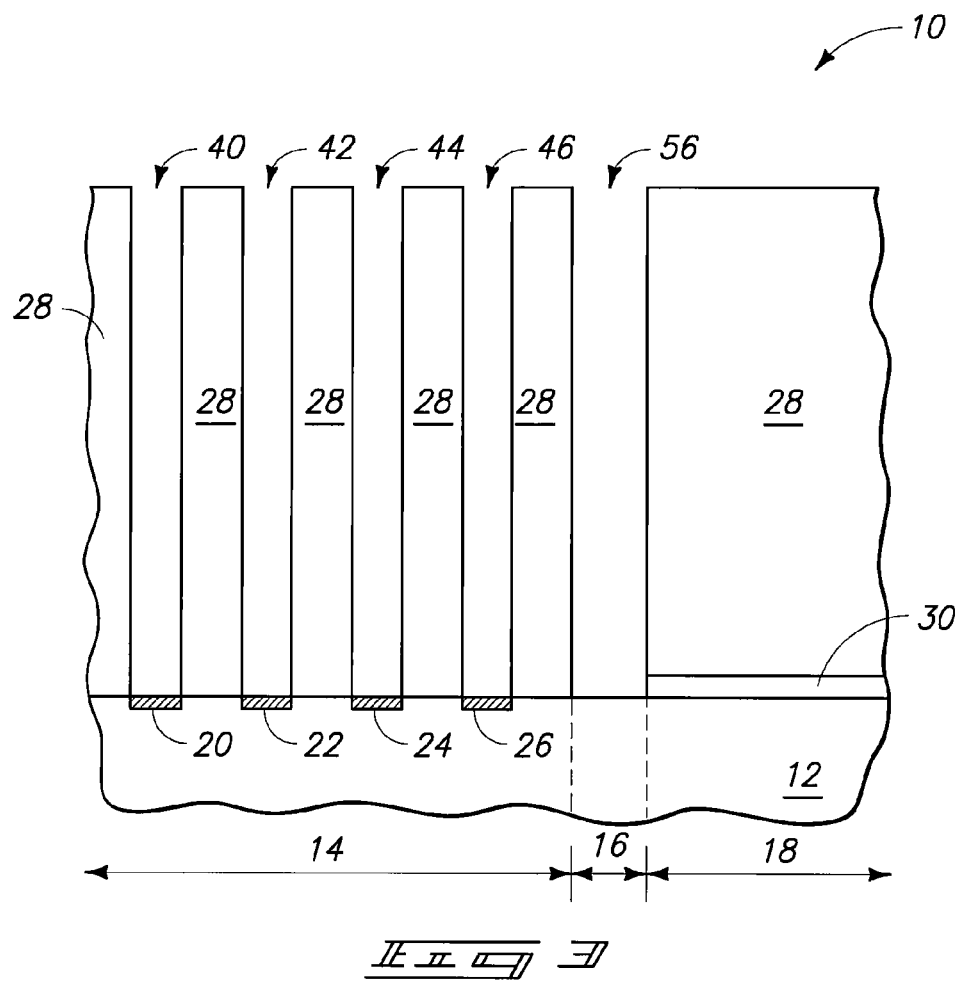
FIG. 3 is a diagrammatic, cross-sectional view of the FIG. 1 wafer portion shown at a processing stage subsequent to that of FIG. 1.

In addition to tapered etch profiles, use of silicon dioxide also may produce feature charging due to its insulative nature. Consequently, the top of a feature, such as an opening in the silicon dioxide, charges negatively relative to the bottom of the feature. Computer simulation has shown the resulting vertical potential gradient as high as several hundred volts, for example, 200 to 300 volts. Such a gradient may retard the flux of positive ions that produce the etching effect and contribute to aspect ratio dependent (ARD) etch, also known as reactive ion etch (RIE) lag. As a result, as aspect ratio increases, etching may become less effective.

It is also possible for a lateral potential gradient to exist. Features across a surface being etched might not be symmetrical, resulting in feature charging differences in lateral directions. Feature asymmetries may result from incoming photo irregularities, asymmetries at the edge of an array compared to the center of an array, or the stochastic nature of plasma polymer deposition. Photo irregularities become apparent on inspection after the development step during photolithography. A lateral potential gradient may orient the flux of positive ions away from true vertical, leading to so-called twisting of etched features. Twisting may become especially noticeable in high aspect ratio (HAR) features. When etching a HAR or other feature, openings may deflect laterally from true vertical. Such twisting may cause electrical opens when the opening misses a landing contact or may cause electrical shorts when the opening twists into an adjacent feature. Embodiments herein may reduce the tapered nature of etch profiles, ARD etch, and feature twisting.

Primarily, the use of support materials better suited to HAR feature etching may provide the desired improvements. While such improvements may be especially noticeable in HAR features, they may nonetheless be realized when etching features with lower aspect ratios.

Referring initially to FIGS. 1 and 2, a construction 10 is shown at a preliminary processing stage of an embodiment. Portion 10 includes a substrate 12. Substrate 12 include a semiconductive material. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Substrate 12 is divided into three defined regions 14, 16 and 18. Region 14 corresponds to a memory array region. Region 18 corresponds to a region other than the memory array region, and can correspond to, for example, a so-called peripheral region. The region is referred to as a peripheral region because it is peripheral to the memory array region. Typically, logic circuitry and other circuitry associated with the control of data flow to and from memory devices associated with memory array region 14 would be associated with peripheral region 18. Region 16 corresponds to a location between the memory array region 14 and the peripheral circuitry associated with region 18. Dashed lines are provided through construction 10 to demarcate the various defined regions 14, 16 and 18 extending within the structure. Various circuit devices (not shown) could be associated with peripheral region 18 at the processing stage of FIG. 1.

A plurality of electrically conductive node locations 20, 22, 24 and 26 are shown within memory array region 14 of substrate 12. Node locations 20, 22, 24 and 26 can correspond to, for example, conductively-doped diffusion regions within a semiconductive material of substrate 12, and/or to conductive pedestals associated with substrate 12. Although the node locations are shown to be electrically conductive at the processing stage of FIG. 1, it is to be understood that the electrically conductive materials of the node locations could be provided at a processing stage subsequent to that of FIG. 1 (not shown). Node locations 20, 22, 24 and 26 can ultimately be electrically connected with transistor constructions (not shown in FIG. 1) and can correspond to source/drain regions of the transistor constructions, or can be ohmically connected to source/drain regions of the transistor constructions. Transistor gates and other components of the transistor constructions can be present within memory array region 14 at the processing stage of FIG. 1, or can be formed in subsequent processing.

A support material 28 is formed over substrate 12. Support material 28 can comprise a single homogeneous layer (as shown), multiple layers of a single homogeneous material, or multiple layers of differing composition and/or physical properties. Support material 28 can comprise, consist essentially of, or consist of one or more electrically insulative and/or electrically conductive materials. In particular, support material 28 may contain at least 20 atomic % (at %) carbon. While 20 at % carbon may be suitable for either insulative or conductive materials, a higher carbon content might contribute to increased conductivity, depending upon the specific material. Consequently, in the case of electrically conductive materials, support material 28 may contain at least 25 at % carbon. Especially in the case of electrically conductive materials, support material 28 may contain at least 50 at % carbon.

The carbon may be primarily in the form of an electrically conductive, carbon backbone polymer or a hydrocarbon-containing, silicate backbone polymer. Although the silicate backbone polymer may be either electrically conductive or electrically insulative, generally such polymers are electrically insulative. Silicate backbone polymers are known containing as much as 36 at % carbon, but which are insulative.

In the case where support material 28 is electrically conductive, feature charging may be reduced. As a result, vertical and/or lateral potential gradients may be reduced, addressing the problems of aspect ratio dependent etch and twisting. Reduction of feature charging thus becomes especially significant for high aspect ratio features. In the case where support material 28 is electrically insulative, even though feature charging is not necessarily reduced, such support materials may provide other benefits described herein.

Support material 28 may further include titanium and/or silicon. The silicon may be primarily in the form of the hydrocarbon-containing, silicate backbone polymer. Alternatively, the silicon may be in another form, for example, in combination with an electrically conductive, carbon backbone polymer. The titanium and/or silicon may be in the form of oxides, which are insulative, or in other forms, which may be insulative or conductive. Titanium and/or silicon may be provided to increase the rigidity of support material 28 beyond the rigidity otherwise exhibited in the absence of titanium and silicon. A more rigid support material 28 may improve stability during subsequent processing. An amount of titanium and/or silicon may be selected to produce the desired effect.

In the case where support material 28 does not include titanium, the silicon might not exceed 26 at %. In the case where support material 28 does not include silicon, the titanium might not exceed 12 at %. In the case where support material 28 includes both titanium and silicon, the titanium might not exceed 7.7 at % and silicon might not exceed 12.5 at %.

Support material 28 may be non-crystalline. For example, support material 28 may consist of amorphous carbon, intermediate carbon, transparent carbon, or a combination thereof. In the context of the present document, "amorphous" carbon refers to carbon that is not crystalline. That is, amorphous carbon includes "transparent" carbon which has some structural regularity due to an increased prevalence of $sp^3$ hybridized bonding (four single bonds per carbon). However, transparent carbon does not exhibit the high degree of structural regularity well known as characteristic of crystalline carbon, for example, diamond, graphite, etc. In comparison, fully amorphous carbon has no structural regularity due to an increased prevalence of $sp^2$ hybridized bonding (one double bond and two single bonds per carbon) and literally "lacks definite form," i.e. is amorphous. Fully amorphous carbon thus includes more aromatic and/or unsaturated hydrocarbons. Understandably, amorphous carbon also includes "intermediate" carbon positioned between fully amorphous carbon and crystalline carbon with regard to its structural regularity. Transparent carbon is thus within the realm of and is one type of intermediate carbon.

One example of transparent carbon contains about 55 at % carbon and about 40 at % hydrogen with the remainder nitrogen and/or oxygen. One example of fully amorphous carbon includes about 70 at % carbon and about 25 at % hydrogen with the remainder nitrogen and/or oxygen. Consequently, support material 28 may consist of from about 55 to about 70 at % carbon, about 5 at % or less of nitrogen, oxygen, sulfur, metals, and semimetals (any of which may be absent), and the remainder hydrogen. "Semimetals" commonly refers at least to boron, silicon, arsenic, selenium, and tellurium.

Forming support material 28 may include applying a liquid mixture to substrate 12 and curing the liquid mixture into a solid. Application of the liquid mixture may be accomplished by known spin-on techniques. Forming support material 28 might be accomplished using other techniques, for example, chemical vapor deposition (CVD), etc. Known CVD techniques for depositing transparent carbon include plasma enhanced CVD and thermal CVD. Plasma enhanced CVD of transparent carbon often occurs at about 375° C.

The liquid mixture may be a mixture of polymer solids and a carrier, and, optionally, a cross-linking agent and/or a catalyst. Potentially suitable liquid mixtures include anti-reflective coating (ARC) material mixtures and/or hard mask (HM) material mixtures. Liquid mixtures known for use in forming anti-reflective coatings and/or hard masks, instead of forming support materials, might be processed largely according to a manufacturer's specifications, including a series of heated baking and/or curing stages. Such processing may evaporate the carrier and other components while cross-linking and/or catalytically reacting (e.g., polymerizing) the polymer solids, leaving behind a support material in keeping with the embodiments herein.

As further appreciated from the discussion herein, alteration of known liquid mixtures and/or the manufacturer's recommended processing may be useful to most effectively obtain a desired support material. In addition to composition of the liquid mixture, consideration may be given to selection of cure temperature and cure time as potentially affecting composition of resulting support materials. For example, curing conditions may influence the type of bonding and/or cross-linking in the support material. Also, for spin-on application, consideration may be given to selection of viscosity, spin speed (revolutions per minute), and dispense volume as affecting thickness of resulting support materials.

Examples of hard mask material mixtures include BSI.M05068B and BSI.S07051 of a proprietary composition available from Brewer Science, Inc. of Rolla, Mo. The former produces an organo-silicate hard mask material containing about 36 at % carbon while the latter produces an organo-titanate-silicate hard mask material containing about 22 at % carbon, with both being insulative. Examples of an ARC material mixture includes BSI.M06089A of a proprietary composition also available from Brewer Science, Inc. The mixture produces an organic (no titanium or silicon) ARC material containing about 44 at % carbon, with the coating being conductive. Examples of known classes of conductive polymers include poly(acetylene)s, poly(pyrrole)s, poly(thiophene)s, poly(aniline)s, poly(fluorene)s, poly(3-alkylthiophene)s, polytetrathiafulvalenes, polynaphthalenes, poly(p-phenylene sulfide), and poly(para-phenylene vinylene)s.

Support material 28 can have a thickness over substrate 12 of, for example, greater than about 1 micrometer (µm). Even so, the thickness might be less than about 3 µm or from 1.5 to 2 µm.

The compositions discussed above for support material 28 and/or the liquid mixtures that might form it have not previously been considered for such a use. Previously, using silicon dioxide dielectric for support material provided easy isolation of array devices from peripheral devices. Also, silicon dioxide generally withstands subsequent high temperature processing. Consequently, no known consideration was given to using hydrocarbon-containing support material, especially if electrically conductive. Hydrocarbon-containing support material might not withstand high temperature processing as well and, if conductive, does not itself isolate peripheral devices.

Figure 4:
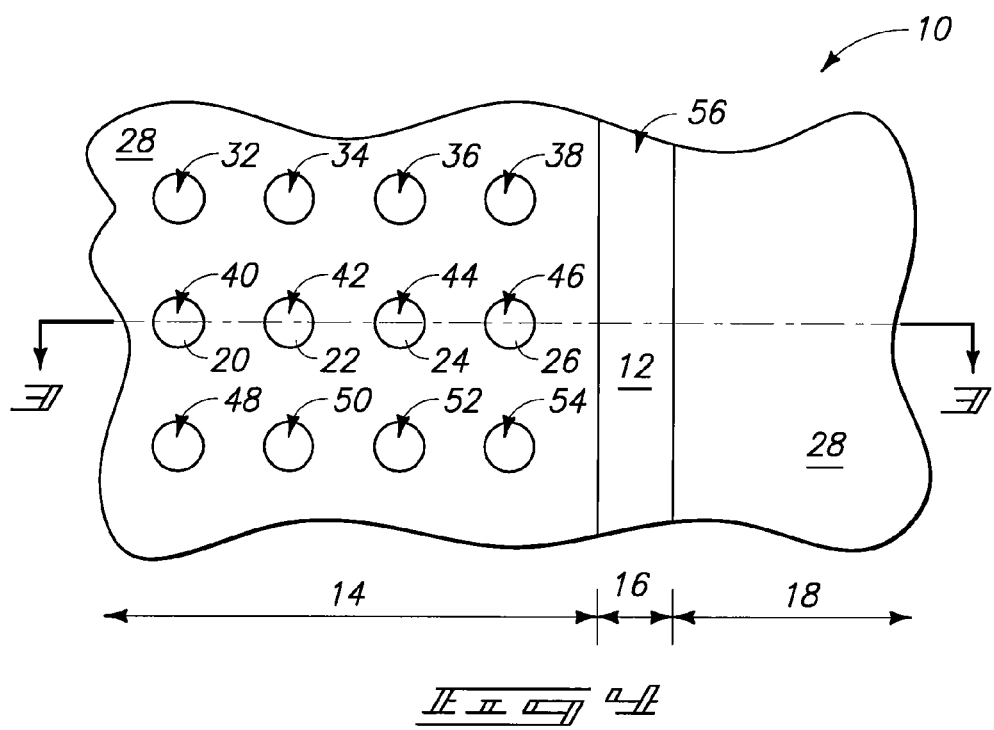
FIG. 4 is a diagrammatic top view of the wafer portion comprising the cross-section shown in FIG. 3 along the line 3-3.

Referring next to FIGS. 3 and 4, openings 32, 34, 36, 38, 40, 42, 44, 46, 48, 50, 52 and 54 are formed through support material 28 to the node locations associated with an upper surface of substrate 12, (with the node locations 20, 22, 24 and 26 being shown in FIG. 3). The openings can have a high aspect ratio, meaning a ratio of about 20:1 or greater or a ratio of 30:1 or greater. The openings can have an elevation of from about 1 to about 3 µm, and a width of about 60 nanometers (nm) or less. The openings are shown to have circular outer peripheries (as illustrated by the top view of FIG. 4), but it is to be understood that the openings can have other shapes. The openings 32, 34, 36, 38, 40, 42, 44, 46, 48, 50, 52, and 54 are ultimately used to form containers of capacitor structures, as discussed in more detail below.

The openings 32, 34, 36, 38, 40, 42, 44, 46, 48, 50, 52, and 54 are formed over memory array region 14 of construction 10 and, while the openings are formed, a trench 56 is formed within region 16 of construction 10. Although trench 56 is shown formed simultaneously with the openings over memory array region 14, and accordingly is shown formed utilizing the same etch as that used to form the openings, it is to be understood that the trench can be, in alternative processing (not shown), formed with an etch separate from that used to form the openings over memory array region 14. Such etch used to form the trench can be conducted either prior to or after the etch used to form the container openings associated with memory array region 14.

Formation of the container openings within memory array region 14 and the trench within region 16 may be accomplished by first forming a photoresist mask (not shown) with photolithographic processing, subsequently transferring a pattern from the patterned mask to underlying material 28, and removing the patterned photoresist mask. The photolithographic requirements associated with formation of the patterned mask can be relatively stringent and, accordingly, an antireflective coating material (not shown) can be incorporated into support material 28, formed beneath support material 28, or formed over support material 28. Of course, if support material 28 is itself an ARC material, than such measures might be omitted. If used, the antireflective coating material may include, for example, a hard film (for example, dielectric antireflective coating (DARC)), a spin-on film (for example, bottom antireflective coating (BARC)), or both.

The forming of openings may be accomplished by a variety of techniques, including anisotropically etching support material 28. Such etching may use a plasma generated from a gas composition containing $O_2$ along with $SO_2$, $SiCl_4$, $N_2$, or $N_2/C_xH_yF_z$, where x, y, and z are integers, $0 \leq x \leq 6$, $0 \leq y \leq 4$, and $0 \leq z \leq 8$. Examples of $C_xH_yF_z$ include $CH_2F_2$, $C_4F_8$, $C_4F_6$, $C_6F_6$ (aromatic), $C_5F_8$, etc. One set of possible anisotropic etching conditions includes supplying $O_2$ and $SO_2$ to an inductively coupled plasma reactor at a total flow rate of about 50 to about 300 standard cubic centimeters per minute (sccm) and a flow rate ratio of $O_2$ to $SO_2$ of 1:2 to 2:1. Another set of possible anisotropic etching conditions includes supplying $O_2$ and $SiCl_4$ to an inductively coupled plasma reactor at a total flow rate of about 500 to about 300 sccm and a flow rate ratio of $O_2$ to $SiCl_4$ of about 5:1. In either set, reactor temperature may be from about 20° to about 100° C. or, more specifically, from 50° to 70° C. Reactor pressure may be from about 5 to about 100 milliTorr or, more specifically, from 20 to 40 milliTorr. Power supplied to the top plate may be from about 500 to about 1200 watts (W) or, more specifically, approximately 850 W. Reactor bias may be from about 20 to about 200 volts or, more specifically, approximately 110 volts. One example of an inductively coupled plasma reactor includes a Lam 2300 Kiyo system available from Lam Research Corporation in Fremont, Calif.

A further set of possible anisotropic etching conditions includes supplying $O_2$ and $N_2$ to a capacitively coupled plasma reactor at a total flow rate of about 100 to about 500 sccm and a flow rate ratio of $O_2$ to $N_2$ of 1:2 to 2:1. A still further set of possible anisotropic etching conditions includes adding $CH_xF_y$, where x and y are integers from 0 to 4 and the sum of x and y equals 4, to the $O_2/N_2$ gas mixture to provide 10 to 50% of the total flow. In either set, reactor temperature may be from about 20° to about 100° C. or, more specifically, from 50° to 70° C. Reactor pressure may be from about 5 to about 100 milliTorr or, more specifically, from 20 to 40 milliTorr. The reactor may operate at dual frequency power with a high frequency power of about 200 to about 1000 W supplied at 27 to 160 megaHertz (MHz) and a low frequency power of about 20 to about 1000 W supplied at 2 to 13.6 (MHz). One example of a capacitively coupled plasma reactor includes a Lam 2300 Exelan system available from Lam Research Corporation in Fremont, Calif.

The properties of support material 28 discussed above, especially with carbon primarily in the form of an electrically conductive, carbon backbone polymer, may be expected to allow much higher aspect ratios than possible in silicon dioxide. The chemical component, as opposed to sputtering component, in anisotropic etching of support material 28 is larger than that of silicon dioxide. Such difference is even more dramatic for carbon backbone polymers. Support material 28 may thus be more effectively anisotropically etched at high aspect ratios.

Trench-style capacitors in crystalline silicon currently in production achieve an aspect ratio of 70:1, with 100:1 demonstrated in research and development. Silicon dioxide support material does not allow nearly as high of aspect ratios due to the ease with which crystalline silicon may be removed compared to silicon dioxide. Support material 28 may enable exceeding such aspect ratios given the properties described herein, which make it more amenable to effective anisotropic etching than crystalline silicon. Additionally, spin-on application of support material to a desired thickness and etching of openings may be integrated into a wider variety of process flows in comparison to forming trench-style capacitors in crystalline silicon. Further, for process flows forming buried digit lines, use of crystalline silicon would involve difficult and expensive epitaxial growth of the silicon. In the event that support material 28 without titanium and/or silicon produces "bowing" of a feature during etching, addition of titanium and/or silicon may decrease the lateral etch rate and help produce a straighter profile.

Openings 32, 34, 36, 38, 40, 42, 44, 46, 48, 50, 52 and 54 are formed in an array within memory array region 14. Such array comprises rows and columns. The rows can be considered to extend horizontally in the view of FIG. 4, and the columns can be considered to extend vertically in the view of FIG. 4. Alternative array arrangements are possible, including offsetting each row by half of a cell compared to adjacent rows to allow higher cell density.

Although openings 32, 34, 36, 38, 40, 42, 44, 46, 48, 50, 52 and 54 are described as extending only through support material 28 to underlying conductive nodes (such as nodes 20, 22, 24, and 26), it is to be understood that one or more other layers (not shown) can be provided between the nodes and support material 28 and that the openings can stop on the other layers. For instance, an etch stop layer (not shown) can be provided between support material 28 and nodes 20, 22, 24, and 26 so that the openings stop on the etch stop layer. An etch stop layer 30 is shown between support material 28 and region 18 of substrate 12. An etch stop layer can protect underlying materials (such as the surface of substrate 12 and/or electrical devices (not shown) supported by the surface) during a subsequent removal of support material 28 (discussed below). An etch stop layer may also mitigate effects of etch non-uniformities, if any. The openings can be extended through the etch stop and to nodes 20, 22, 24, and 26 with a second etch after the etch through support material 28. The etch stop can include any suitable material to which support material 28 can be selectively etched, and can, for example, be silicon nitride.

Referring next to FIGS. 5 and 6, a conductive material 60 is formed within openings 32, 34, 36, 38, 40, 42, 44, 46, 48, 50, 52 and 54, as well as within trench 56. Electrically conductive material 60 can be a homogeneous composition of electrically conductive material, or can comprise multiple layers of electrically conductive material. The electrically conductive materials within material 60 can comprise any suitable materials, including, for example, metal, metal compounds, and conductively-doped silicon. For example, conductive material 60 may include titanium, titanium nitride, platinum, tungsten, silicon, ruthenium, etc.

Portions of conductive material 60 within the openings in memory array region 14 can be considered to form container structures within the openings. For instance, FIG. 5 shows the portions of conductive material 60 within openings 40, 42, 44 and 46 corresponding to container structures 62, 64, 66 and 68. The container structures can be considered to include inner surfaces 70 within the openings and outer surfaces 72 laterally opposed to the inner surfaces. The outer surfaces 72 contact and extend along support material 28 in the Figures. However, other materials (not shown) might be formed between outer surfaces 72 and support material 28.

Portions of conductive material 60 may ultimately be incorporated into a capacitor electrode, for example, a capacitor storage node. Accordingly, conductive material 60 may be referred to as capacitor electrode material, or as capacitor storage node material.

Conductive material 60 is only shown to partially fill openings 32, 34, 36, 38, 40, 42, 44, 46, 48, 50, 52 and 54, and thus forms container structures within the openings. Alternatively, conductive material 60, either alone or in combination with other conductive materials, can completely fill the openings to form pedestal (or post) structures within the openings. The structures formed from conductive material 60 in the openings (i.e., the container structures or pedestal structures) can be referred to as capacitor structures, since they may ultimately be incorporated into capacitors.

Figure 7:
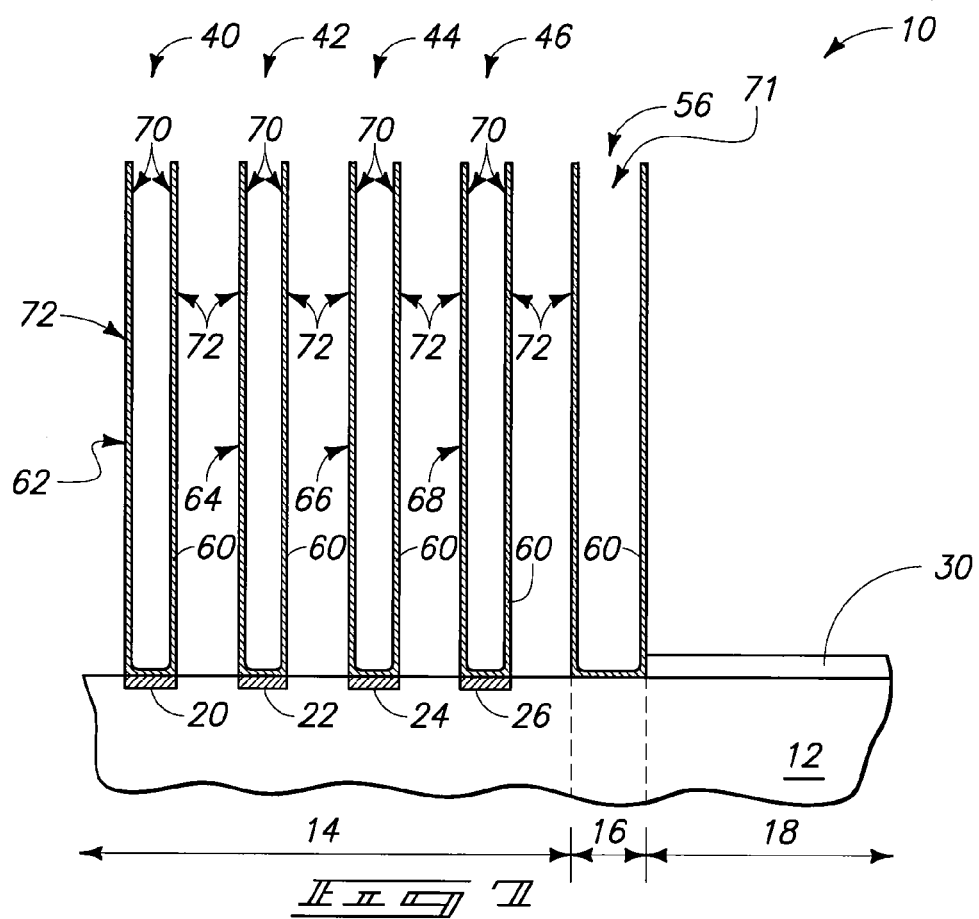
FIG. 7 is a diagrammatic, cross-sectional view of the FIG. 1 wafer portion shown at a processing stage subsequent to that of FIG. 5.
Figure 8:
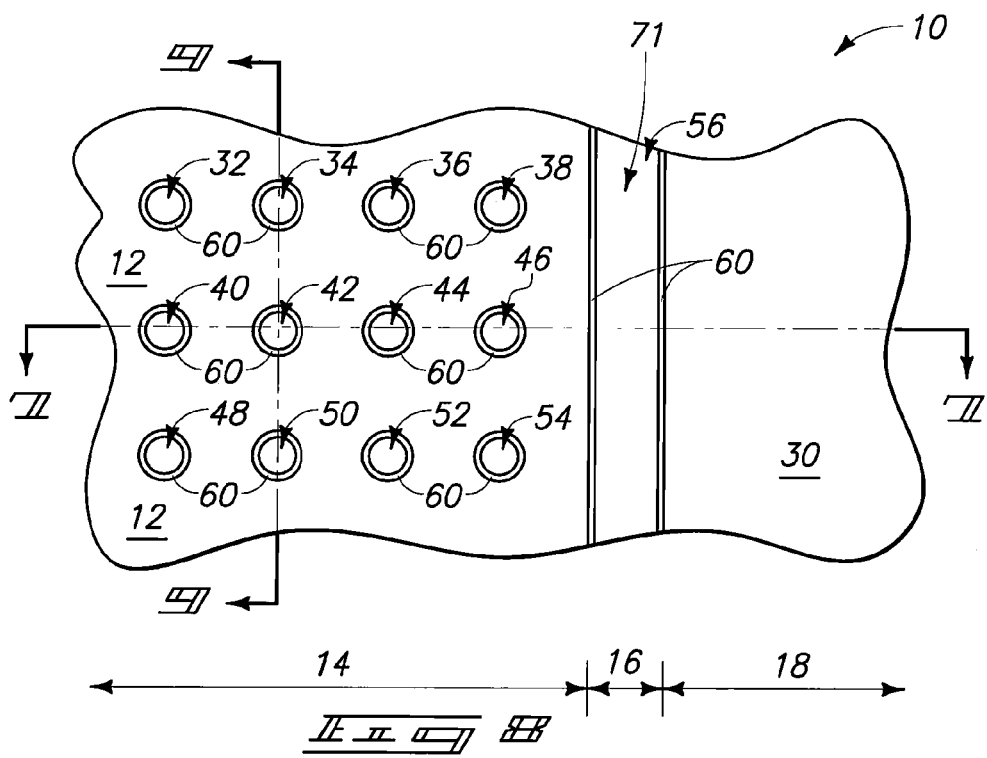
FIG. 8 is a diagrammatic top view of the wafer portion comprising the cross-section shown in FIG. 7 along the line 7-7.
Figure 9:
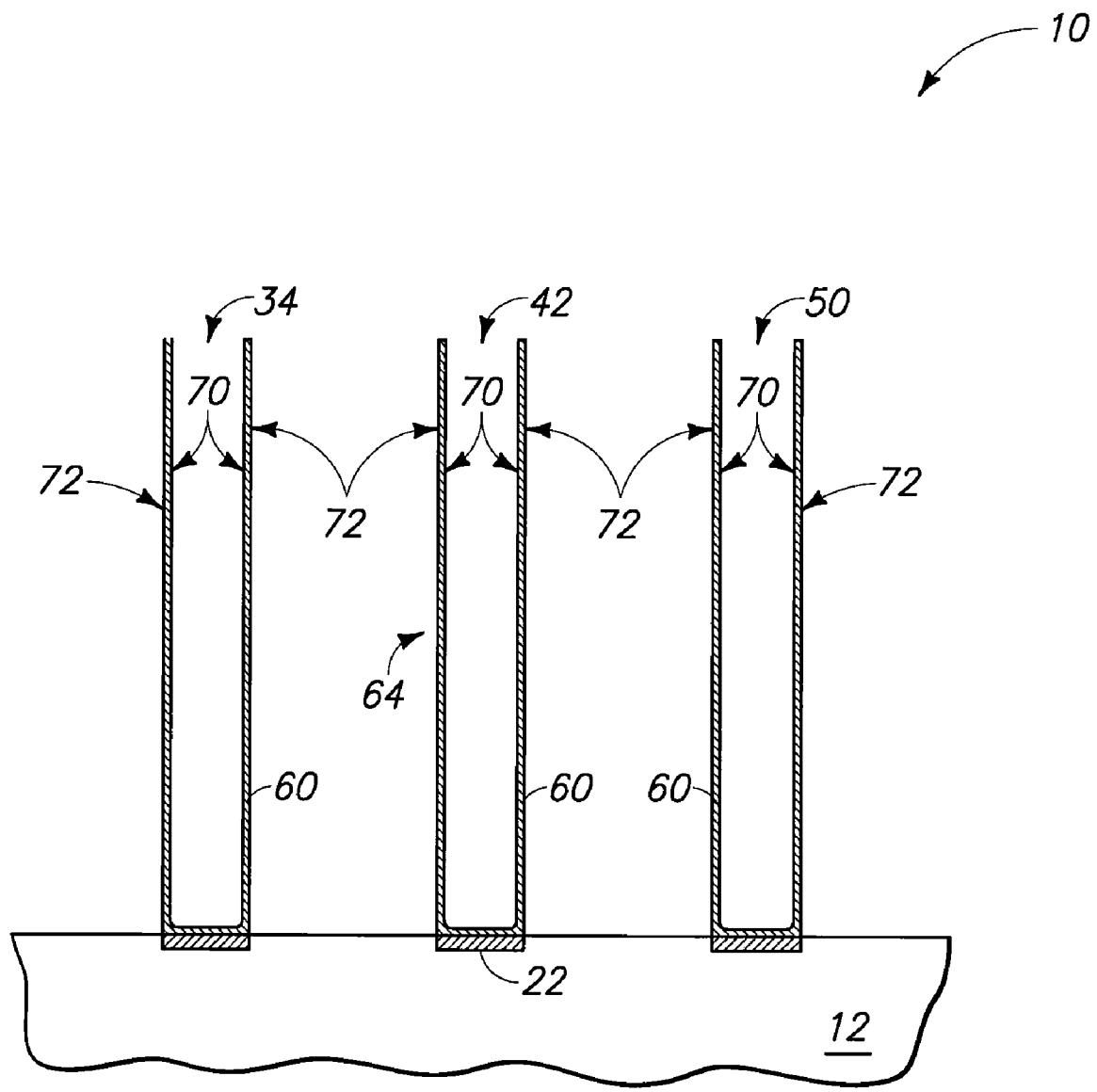
FIG. 9 is a diagrammatic, cross-sectional view along the line 9-9 of FIG. 8.

Referring next to FIGS. 7-9, portions of conductive material 60 outside of openings 32, 34, 36, 38, 40, 42, 44, 46, 48, 50, 52 and 54 are removed, which creates discrete capacitor structures (specifically, container structures) in the openings. The removing may be accomplished by chemical-mechanical planarization (CMP), dry etch back, etc. In the case of dry etch back, openings 32, 34, 36, 38, 40, 42, 44, 46, 48, 50, 52, and 54 and trench 56 may first be filled, e.g. with a resist, to avoid removal of conductive material therein. CMP may avoid the additional resist formation.

Support material 28 is also removed. The removal of support material 28 exposes outer surfaces 72 of the capacitor structures (such as, for example, the container structures 62, 64, 66 and 68 of FIG. 7) previously contacted by support material 28. In FIGS. 7-9, support material 28 is substantially entirely removed from over memory array region 14 and, accordingly, an entirety of outer surfaces 72 are exposed. It is conceivable that only a portion of support material 28 over memory array region 14 might be removed and, accordingly, only portions of the outer surfaces 72 might be exposed.

FIGS. 7-9 show support material 28 also substantially entirely removed from over region 16 and peripheral region 18 and, accordingly, etch stop 30 is exposed. Alternatively, support material 28 may be retained over peripheral region 18 by forming a protective material. The protective material may be formed after removing the portions of conductive material 60 outside of the openings. Protective material may include, for example, a thin DARC described above, which in combination with conductive material 60 in trench 56 may prevent removal of support material 28, as discussed further below. After removing conductive material 60 outside of openings 32, 34, 36, 38, 40, 42, 44, 46, 48, 50, 52 and 54, the protective material may be formed over memory array region 14, region 16, and peripheral region 18. A photoresist may be formed over peripheral region 18 and the protective material removed from memory array region 14 and region 16. Remaining photoresist over peripheral region 18 may then be removed at the same time as support material 28 is removed from over array region 14 and region 16, retaining support material 28 over peripheral region 18.

Conductive material 60 associated with individual containers shown in FIGS. 7-9 bears the shape of an annulus or a ring. It is to be understood, however, that material 60 may be formed in different shapes. Also, as discussed previously, material 60 (alone or in combination with other conductive materials) may be in the shape of a pedestal instead of being in the shown shape of a container.

Removal of support material 28 may be accomplished by dry stripping, among other possible dry or wet techniques, including a piranha etch known to those of ordinary skill. Dry stripping may include forming a plasma and exposing support material 28 to oxygen radicals generated by the plasma. As an added measure, formation of the plasma may use a gas containing $O_2$ and $NH_3$, where $NH_3$ assists in reducing oxidation of metals exposed to the dry stripping. If dry stripping is used, then a material other than a photoresist may be used for the protective material over peripheral region 18 to avoid exposure and removal of underlying support material 28 as a result of dry stripping. Atomic layer deposition of silicon dioxide may be accomplished at low temperature to provide protective material that withstands the dry stripping.

Known dry stripping systems exist and might be referred to as "microwave strippers." A perforated grate-like structure between the plasma and a substrate being dry stripped prevents plasma contact with and damage to the substrate, but allows oxygen radicals through the grate to isotropically etch. Known dry stripping systems are available from Mattson Technology, Inc. in Fremont, Calif. and Axcelis Technologies in Beverly, Mass. Often, dry stripping systems are used as a simple, effective technique to remove carbon-containing polymers, such as photoresist and unwanted processing residues, to clean substrates prior to subsequent processing. Support material 28 may be similar to such photoresist or residues in that they all contain carbon, but different in that support material 28 may exhibit a much greater thickness when used for forming high aspect ratio structures. Appropriate modification of processing times or other parameters may adapt known dry stripping processes to removing support material 28. Notably, dry stripping of carbon-containing support material 28 constitutes a much easier removal technique compared to the prior wet etching of silicon dioxide or crystalline silicon (in the case of trench-style capacitors).

While using titanium and/or silicon in support material 28 may add rigidity, such additives might make support material 28 less susceptible to dry stripping. Titanium and/or silicon present as oxides might make support material even less susceptible to dry stripping. Despite such potential drawback, use of titanium and/or silicon may nevertheless be desirable for some applications given the structural properties and anisotropic etching properties. Similarly, use of silicate backbone polymers may decrease susceptibility to dry stripping compared to use of carbon backbone polymers.

Conductive material 60 in trench 56, together with the protective material mentioned above over peripheral region 18 may form a barrier (or shield) so that the isotropic etching of support material 28 over memory array region 14 does not extend into the support material 28 associated with peripheral region 18. Such can alleviate damage to circuitry (not shown) associated with peripheral region 18 that could otherwise occur if an isotropic etch penetrated into the support material 28 associated with peripheral region 18. The protective material 60 within trench 56 forms a protective trough (or moat) 71 which protects support material 28 of peripheral region 18 from the isotropic etch used in removing support material 28 from over memory array region 14. In the Figures, the moat is double-sided. In other words, conductive material 60 covers both sides of trench 56. It is to be understood, however, that the conductive material might be formed only along the side of trench 56 nearest peripheral region 18 and, thus, not on the side of trench 56 nearest memory array region 14.

Often, high aspect ratio structures, such as shown in the Figures, are provided with retaining structures to reduce toppling during processing. Examples of retaining structures are shown in U.S. Pat. No. 7,125,781 issued Oct. 24, 2006 to Manning et al., among numerous other references. For simplicity, retaining structures are not shown herein but may be included according to known techniques.

Figure 10:
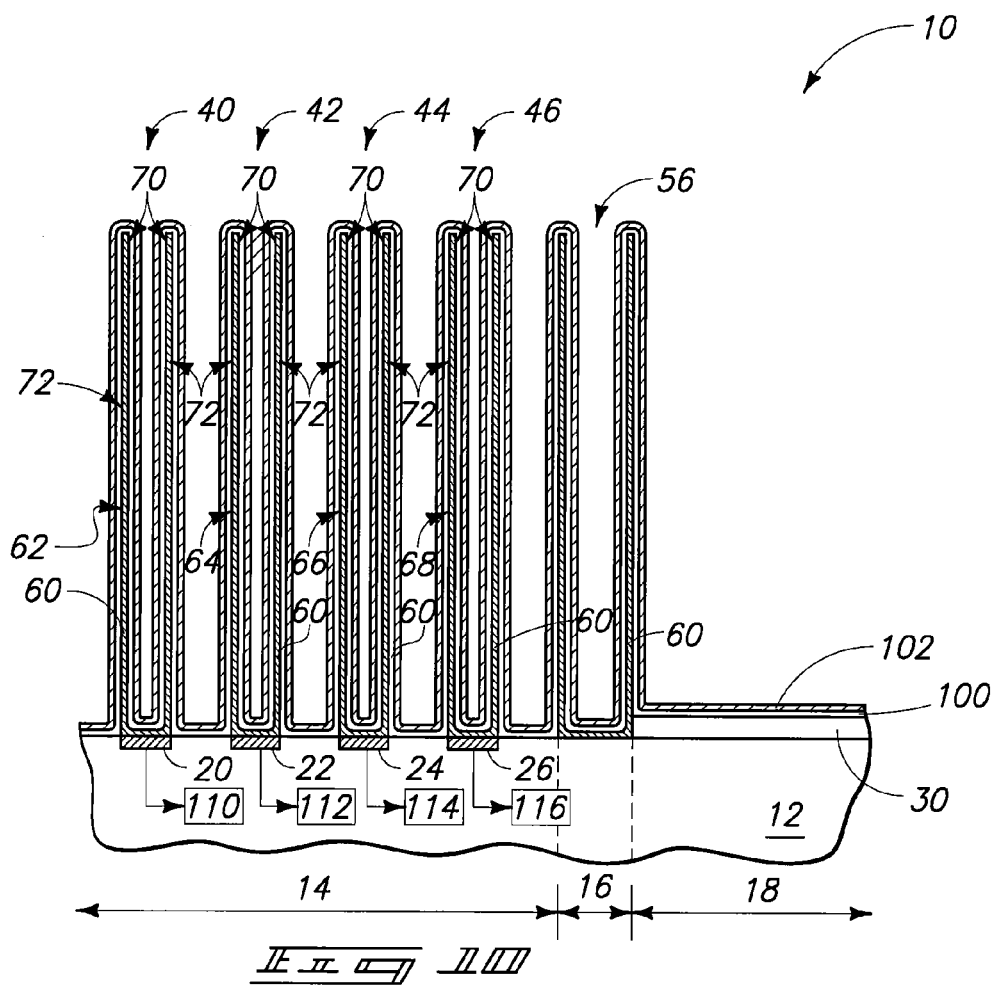
FIG. 10 is a diagrammatic, cross-sectional view of the FIG. 1 wafer portion shown at a processing stage subsequent to that of FIG. 7.
Figure 11:
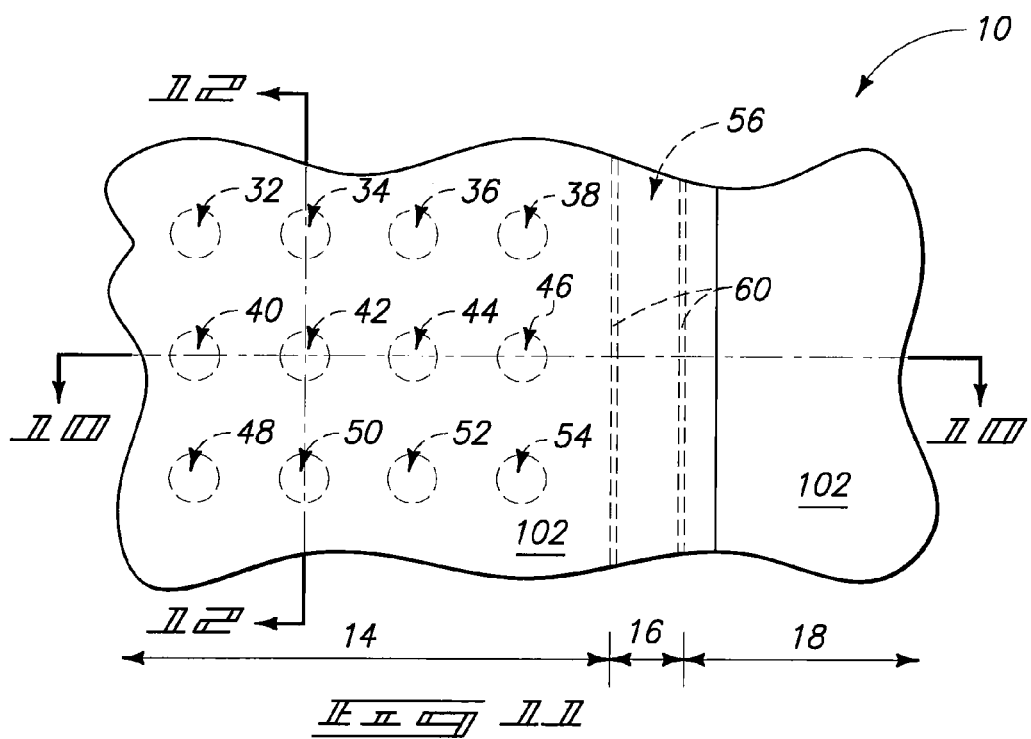
FIG. 11 is a diagrammatic top view of the wafer portion comprising the cross-section shown in FIG. 10 along the line 10-10.
Figure 12:
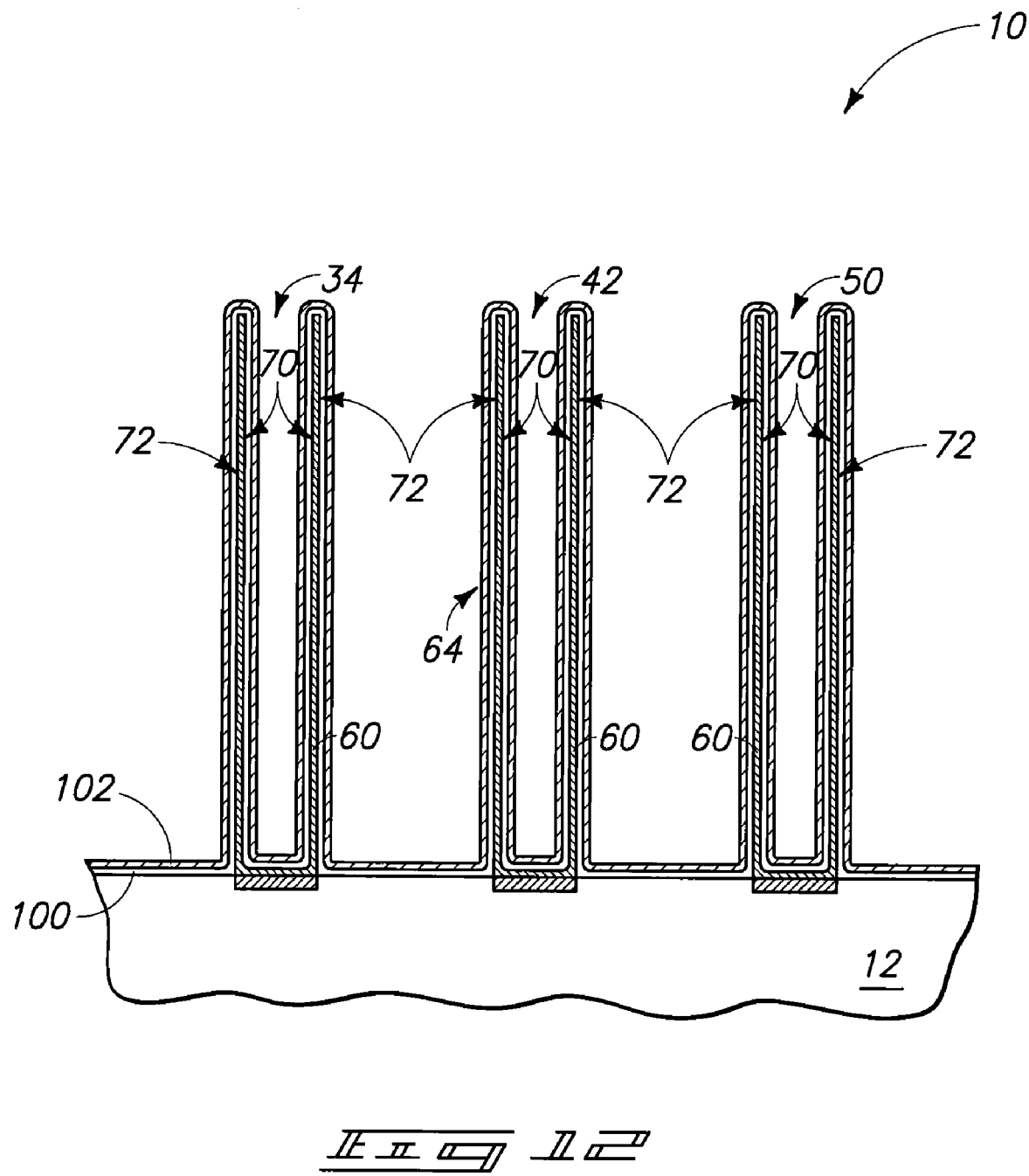
FIG. 12 is a diagrammatic, cross-sectional view along the line 12-12 of FIG. 11.

Referring next to FIGS. 10-12, a dielectric material 100 and a conductive material 102 are formed within openings 32, 34, 36, 38, 40, 42, 44, 46, 48, 50, 52 and 54, as well as along outer sidewall edges 72 of the container structures. Conductive material 60 of the capacitor container structures can be referred to as a first capacitor electrode, and conductive material 102 can be referred to as a second capacitor electrode. The capacitor electrodes 60 and 102, together with dielectric material 100, form an array of capacitor structures within the array of openings 32, 34, 36, 38, 40, 42, 44, 46, 48, 50, 52 and 54. The openings, together with trench 56, are shown in phantom view in FIG. 11 to indicate that such are below conductive material 102 in the shown view. Although the shown capacitors are container capacitors, it is to be understood that the capacitors can also be pedestal capacitors (i.e., can comprise the dielectric material 100 and the conductive material 102 extending around pedestals of material 60).

Transistor structures 110, 112, 114 and 116 are diagrammatically illustrated in FIG. 10. The transistor structures would have source/drain regions either encompassing node locations 20, 22, 24 and 26, or ohmically connected with node locations 20, 22, 24 and 26. The transistor devices and capacitor structures formed in accordance with the methodology herein can be together incorporated into an array of DRAM cells.

In keeping with the discussion above, various embodiments are encompassed herein. According to one embodiment, a capacitor forming method includes forming an electrically conductive support material over a substrate, forming an opening through at least the support material to the substrate, and, after forming the opening, forming a capacitor structure contacting the substrate and the support material in the opening. The support material contains at least 25 at % carbon. By way of example, the method may further include, after forming the capacitor structure, removing at least a part of the support material. The removing may expose any part of the capacitor structure contacted by the support material. The removing may include removing all of the support material.

According to a further embodiment, a capacitor forming method includes forming a non-crystalline, electrically conductive support material over a substrate. An opening is anisotropically etched through at least the support material to the substrate and, after forming the opening, a first capacitor electrode is formed in the opening. After forming the first electrode, the method includes dry stripping all of the support material. The support material contains at least 50 at % carbon, which is primarily in the form of an electrically conductive, carbon backbone polymer.

In another embodiment, a capacitor forming method includes forming a support material over a substrate, forming an opening through at least the support material to the substrate, and, after forming the opening, forming a capacitor structure contacting the substrate and the support material in the opening. The support material contains at least 20 at % carbon. The support material has a thickness and the opening has an aspect ratio of 20:1 or greater within the thickness of the support material.

In a further embodiment, a capacitor forming method includes forming a non-crystalline support material over a substrate, anisotropically etching an opening through at least the support material to the substrate, and, after forming the material, forming a first capacitor electrode in the opening. The support material contains at least 25 at % carbon, which is primarily in the form of an electrically conductive, carbon backbone polymer or a hydrocarbon-containing, silicate backbone polymer. The support material has a thickness of greater than 1 μm and the opening has an aspect ratio of 20:1 or greater within the thickness of the support material.

As yet another embodiment, a capacitor forming method includes spin-on applying a support material mixture on a substrate, curing the support material mixture, and forming an opening at least through the support material to the substrate. The support material mixture is an antireflective coating material mixture or a hard mask material mixture. The cured support material contains at least 20 at % carbon. After forming the opening, a capacitor structure is formed contacting the substrate and the support material in the opening. After forming the capacitor structure, the method includes removing the support material. The removing exposes the capacitor structure contacted by the support material. By way of example, the opening may have a thickness from the substrate to the uppermost extent of the opening and a majority of the thickness may consist of the support material. Further, all of the thickness may consist of the support material.

In the various embodiments, the capacitor structure may be a first capacitor electrode. The methods may further include forming a dielectric material contacting the first electrode and forming a second capacitor electrode contacting the dielectric material.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A capacitor forming method comprising:
    forming an electrically conductive support material over a substrate, the support material containing at least 25 at % carbon, the carbon being primarily in the form of an electrically conductive, carbon backbone polymer;
    forming an opening through at least the support material to the substrate; and
    after forming the opening, forming a capacitor structure contacting the substrate and the support material in the opening.

2. A capacitor forming method comprising:
    forming an electrically conductive support material over a substrate, the support material consisting of from about 55 to about 70 at % carbon, about 5 at % or less of nitrogen, oxygen, sulfur, metals, and semimetals, and the remainder hydrogen;
    forming an opening through at least the support material to the substrate; and
    after forming the opening, forming a capacitor structure contacting the substrate and the support material in the opening.

3. A capacitor forming method comprising:
    forming a support material over a substrate, the support material containing at least 20 at % carbon, the support material comprising titanium, the titanium in the support material not exceeding 12 at %, the support material not comprising silicon;
    forming an opening through at least the support material to the substrate, the support material having a thickness and the opening having an aspect ratio of 20:1 or greater within the thickness of the support material; and
    after forming the opening, forming a capacitor structure contacting the substrate and the support material in the opening.

4. A capacitor forming method comprising:
    forming a support material over a substrate, the support material containing at least 20 at % carbon, the support material comprising titanium and silicon, titanium in the support material not exceeding 7.7 at %, and silicon in the support material not exceeding 12.5 at %;
    forming an opening through at least the support material to the substrate, the support material having a thickness and the opening having an aspect ratio of 20:1 or greater within the thickness of the support material; and
    after forming the opening, forming a capacitor structure contacting the substrate and the support material in the opening.

5. A capacitor forming method comprising:
    forming an electrically conductive support material over a substrate, the support material containing at least 25 at % carbon, the support material further comprising titanium;
    forming an opening through at least the support material to the substrate; and
    after forming the opening, forming a capacitor structure contacting the substrate and the support material in the opening.

6. The method of claim 5 wherein the support material comprises silicon.

7. A capacitor forming method comprising:
    forming a non-crystalline, electrically conductive support material over a substrate, the support material containing at least 50 at % carbon, which is primarily in the form of an electrically conductive, carbon backbone polymer;
    anisotropically etching an opening through at least the support material to the substrate;
    after forming the opening, forming a first capacitor electrode in the opening;
    after forming the first electrode, dry stripping all of the support material;
    forming a dielectric material contacting the first electrode; and
    forming a second capacitor electrode contacting the dielectric material.

8. The method of claim 7 wherein the support material consists of from about 55 to about 70 at % carbon, about 5 at % or less of nitrogen, oxygen, sulfur, metals, and semimetals, and the remainder hydrogen.

9. The method of claim 7 wherein the support material further comprises titanium and/or silicon.

10. A capacitor forming method comprising:
    forming a non-crystalline support material over a substrate, the support material containing at least 25 at % carbon, which is primarily in the form of an electrically conductive, carbon backbone polymer or a hydrocarbon-containing, silicate backbone polymer;
    anisotropically etching an opening through at least the support material to the substrate, the support material having a thickness of greater than 1 μm and the opening having an aspect ratio of 20:1 or greater within the thickness of the support material;
    after forming the opening, forming a first capacitor electrode in the opening;
    forming a dielectric material contacting the first electrode; and
    forming a second capacitor electrode contacting the dielectric material.

11. The method of claim 10 wherein the support material comprises an electrically conductive hydrocarbon-containing, silicate backbone polymer.

12. A capacitor forming method comprising:
    forming a support material over a substrate, the support material containing at least 20 at % carbon; the carbon being primarily in the form of an electrically conductive, carbon backbone polymer or a hydrocarbon-containing, silicate backbone polymer;
    forming an opening through at least the support material to the substrate, the support material having a thickness and the opening having an aspect ratio of 20:1 or greater within the thickness of the support material; and after forming the opening, forming a capacitor structure contacting the substrate and the support material in the opening.

13. The method of claim 12 wherein the support material is electrically insulative.

14. The method of claim 12 wherein the support material is non-crystalline.

15. The method of claim 12 wherein forming the opening comprises anisotropically etching the support material.

16. The method of claim 12 wherein the thickness is greater than 1 µm.

17. The method of claim 12 wherein the capacitor structure is a first capacitor electrode and the method further comprises forming a dielectric material contacting the first electrode and forming a second capacitor electrode contacting the dielectric material.

18. The method of claim 12 wherein
the support material comprises an electrically conductive hydrocarbon-containing, silicate backbone polymer.

19. The method of claim 12 wherein the support material further comprises titanium and/or silicon.

20. The method of claim 19 wherein silicon does not exceed 26 at % and the support material does not comprise titanium.

* * * * *